United States Patent
Perner et al.

(10) Patent No.: US 7,221,582 B2
(45) Date of Patent: May 22, 2007

(54) METHOD AND SYSTEM FOR CONTROLLING WRITE CURRENT IN MAGNETIC MEMORY

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 268 days.

(21) Appl. No.: 10/649,078

(22) Filed: Aug. 27, 2003

(65) Prior Publication Data

US 2005/0047200 A1     Mar. 3, 2005

(51) Int. Cl.
   *G11C 11/00*     (2006.01)
(52) U.S. Cl. .................. 365/158; 365/171
(58) Field of Classification Search ........... 365/158, 365/233, 213, 232, 97, 55
   See application file for complete search history.

(56) References Cited

U.S. PATENT DOCUMENTS

| | | | |
|---|---|---|---|
| 5,293,335 A * | 3/1994 | Pernisz et al. .............. 365/148 |
| 6,363,000 B2 | 3/2002 | Perner et al. |
| 6,713,830 B2 * | 3/2004 | Nishimura et al. ......... 257/421 |
| 6,781,874 B2 * | 8/2004 | Hidaka ...................... 365/171 |
| 6,839,272 B2 * | 1/2005 | Ooishi ........................ 365/171 |
| 2002/0041515 A1 * | 4/2002 | Ikeda et al. ................. 365/158 |
| 2004/0001360 A1 * | 1/2004 | Subramanian et al. ...... 365/188 |
| 2004/0041515 A1 * | 3/2004 | Speer et al. ................ 313/490 |
| 2004/0095804 A1 * | 5/2004 | Hidaka ...................... 365/171 |
| 2004/0257855 A1 * | 12/2004 | Hilton ........................ 365/150 |

FOREIGN PATENT DOCUMENTS

EP         1111619 A2       6/2001

* cited by examiner

*Primary Examiner*—Thong Q. Le

(57) ABSTRACT

Methods and apparatuses are disclosed for controlling the write current in magnetic memory. In some embodiments, the method includes: providing a current in a plurality of memory write lines (where the write lines may be magnetically coupled to at least one memory element), coupling a first and second plurality of transistors to either end of the memory write line, and altering the conduction state of individual transistors within the first and second plurality of transistors.

24 Claims, 2 Drawing Sheets

METHOD AND SYSTEM FOR CONTROLLING WRITE CURRENT IN MAGNETIC MEMORY

BACKGROUND

Computers have become an integral part of society. Computers are complex and may include microprocessors, storage media (e.g., CD-ROM, hard drive, floppy drive), memory, and input/output devices. In general, the microprocessor executes instructions from various software programs that may be running on the computer. While running the programs, the microprocessor may need to read and write information to and from memory.

Recent trends in memory include solid state magnetic memory arrays. Magnetic memory arrays may have advantages over non-magnetic memory arrays (e.g., DRAM) because, among other things, they do not need to be refreshed. Magnetic memory may contain individual memory elements, where the electrical resistance of the individual memory element may indicate the digital information contained in the memory element. Digital information contained in the memory element may be altered by passing electrical current in one or more memory write lines, where the write lines may be magnetically coupled to a magnetic memory element.

As a result of the current in the memory write lines, a magnetic field may be induced in the memory element, which may then alter the digital state in the memory element. The amount of current necessary to alter the state of the memory element from a high value to a low value, or vice versa, may be a specified amount. To provide the specified amount of current to a memory write line, the current may need to be controlled, which presents challenges.

Controlling the amount of current applied to memory write lines may be problematic because as newer generations of integrated circuits evolve, lower supply voltages are used. However, the circuitry used in controlling the amount of current supplied to a memory write line may consume part of this reduced supply voltage. Because the total amount of supply voltage is reduced and the circuitry that controls the current in the write line may consume part of this reduced voltage, the amount of voltage remaining may not be enough to provide the specified amount of current to the memory write line.

BRIEF SUMMARY

Methods and apparatuses are disclosed for controlling the write current in magnetic memory. In some embodiments, the method includes: providing a current in a plurality of memory write lines (where the write lines may be magnetically coupled to at least one memory element), coupling a first and second plurality of transistors to either end of the memory write line, and altering the conduction state of individual transistors within the first and second plurality of transistors.

BRIEF DESCRIPTION OF THE DRAWINGS

For a detailed description of the various embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ".

The term "couple" or "couples" is intended to mean either an indirect or direct electrical connection. Thus, if a first device couples to a second device, that connection may be through a direct electrical connection, or through an indirect electrical connection via other devices and connections. However, the phrase "magnetically coupled" is also intended to refer to the situation in which a magnetic field emanating from a first material is induced in second material. For example, a conductor carrying a current may emanate a magnetic field which may be coupled into a magnetic material.

The term "gate terminal" is intended to refer to the terminal of a transistor that controls the transistor's conduction state, regardless of the technology used. The term "constant" in so far as it relates to power supplies is intended to refer to minor variations in a particular parameter. For example, a power supply with constant current and variable voltage will have a voltage that may change significantly, while the current will have only minor variations.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
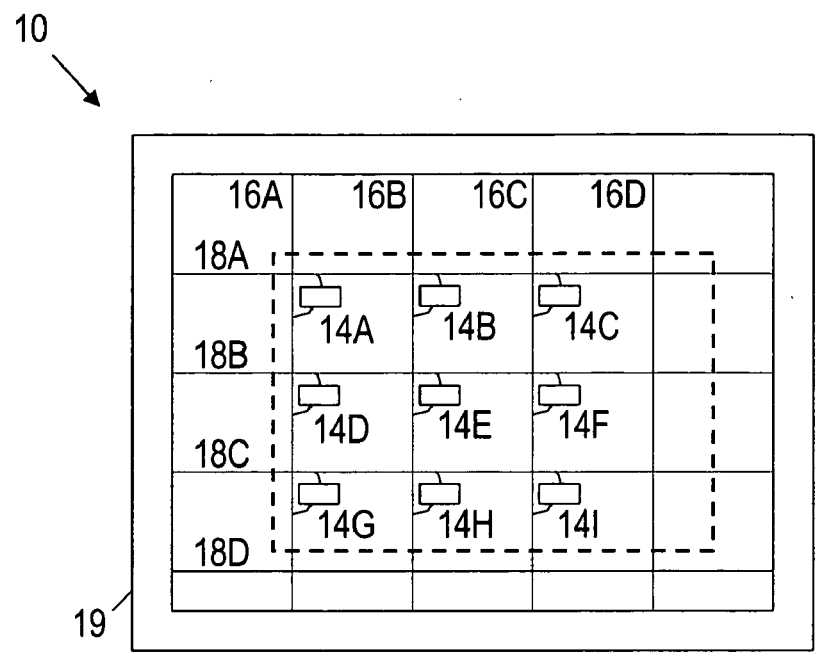
FIG. 1 illustrates memory elements which may be coupled together in a cross-point array configuration.

FIG. 1 depicts a magnetic memory 10 that may be integrated as an array on an integrated circuit. In general, the array includes memory elements 14A–I, which may be magnetically coupled to write lines as shown by the dashed lines. The magnetic memory elements may be modeled using various devices such as capacitors, resistors, inductors, tunnel junctions in series with diodes, or other combinations of integrated circuit elements. The write lines may be organized in columns 16A–D and rows 18A–D. Accompanying circuitry 19 may be coupled to write lines 16 and 18, and may assist in writing data to the array 12. Although not shown in FIG. 1, read lines may be electrically coupled to the memory elements 14A–I in order to perform read operations.

In writing data to individual memory elements, current may be provided to write lines 16 and 18. For example, in writing data to memory element 14E, current may be provided to column 16B and row 18B. The current flowing in write lines 16B and 18B may then induce magnetic fields in memory element 14E and alter its digital state. Because other memory elements in the array 12 may share common write lines, the current intended to create a magnetic field in a desired memory element may induce unwanted magnetic fields in other memory elements also. The unwanted magnetic fields are often referred to as "half-selected" magnetic fields since only one of the two induce magnetic fields may be present for the undesired memory element. For example, in writing information to memory element 14E, magnetic fields may be undesirably induced in memory elements 14B and 14H, which are also magnetically coupled to write line 16B. In general, the amount of magnetic field generated may be related to the amount of current flowing in a write line. Thus, in order to write information to a desired memory element, it may be advantageous to distinguish among the memory elements in the array by controlling the amount of current in write lines. Accordingly, the amount of current in the write lines should be greater than the threshold of the desired memory element and less than the half-select threshold for the undesired memory elements, which may be coupled to the same row and column lines as the desired memory element.

Figure 2:
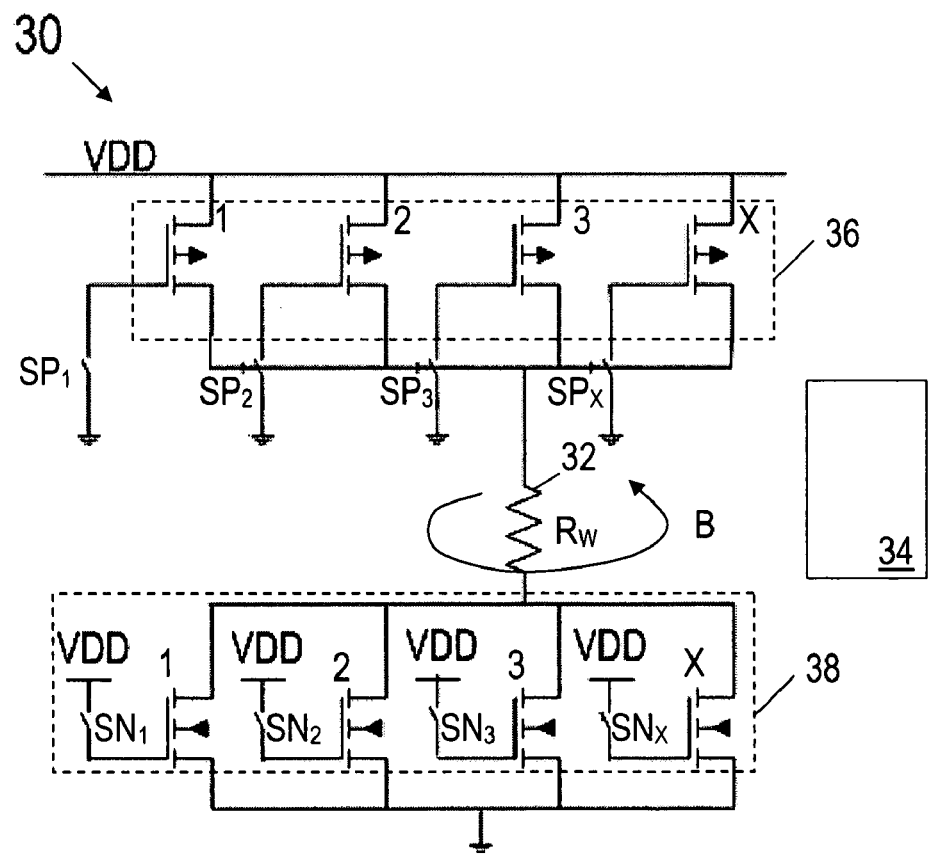
FIG. 2 shows a circuit in accordance with various embodiments.

FIG. 2 shows an embodiment of the present invention that may be used as a magnetic memory write line driver. Circuit 30 may provide desired current control in a magnetic memory write line 32 while minimizing the amount of overhead voltage utilized and simplifying overall circuit design. Memory write line 32 may be magnetically coupled to magnetic memory element 34. The supply voltage, indicated as $V_{DD}$, may be electrically coupled to the source terminals of a plurality of p-channel MOSFETs 36. MOSFETs 36 may have their drains electrically coupled to a write line 32, which may be represented as resistive element $R_W$. Write line 32 may also be electrically coupled to the drain terminal a plurality of n-channel MOSFETs 38, and the source connection of MOSFETs 38 may be electrically coupled to ground.

The gate connection of transistors 38 may be electrically coupled to $V_{DD}$ through switches $SN_1$–$SN_X$. Likewise, the gate connection of transistors 36 may be electrically coupled to ground through switches $SP_1$–$SP_X$ as shown. The amount of current required in write line 32 to write memory element 34 to a digital value may be a predetermined value. Circuit 30 may control the amount of current in write line 32 by turning on any number of switches $SN_X$ and $SP_X$ in any order. By combining transistors in this fashion, the effective resistances $R_{DSn}$ and $R_{DSp}$ can be dynamically adjusted. Further, individual transistors within the pluralities of transistors 36 and 38 may not be sized similarly. For example, individual transistors may be binary weighted such that transistor 1 has a size of ½ X, transistor 2 has a size of X, and transistor 3 has a size of 2X. With the transistors binary weighted in this fashion, they may be able to contribute to the amount of write current in write line 32 differently. The switches $SN_X$ and $SP_X$ may represent logic gates electrically coupled to the gate terminals of transistors 36 and 38.

As switches $SP_X$ couple the gates of transistors 36 to ground, the gate-to-source voltage of transistors 36 may be equal to $-V_{DD}$, which is the maximum voltage available in circuit 30. Likewise switches $SN_X$ may couple the gates of transistors 38 to $V_{DD}$, which also may yield the maximum possible gate-to-source voltage available in circuit 30. In general, when the gate-to-source voltage of a transistor is at a maximum, the resistance may be at a minimum value. Since transistors 36 and 38 may be configured with a minimal resistance value, they may have a lower drain-to-source voltage than other solutions. Accordingly, circuit 30 may be able to control the amount of current in write line 32 by using less overhead voltage than would otherwise be required. Although $V_{DD}$ may supply a variable current to the write line, the voltage supplied by $V_{DD}$ does not need to be varied in order to supply the variable current to the write line.

Figure 3:
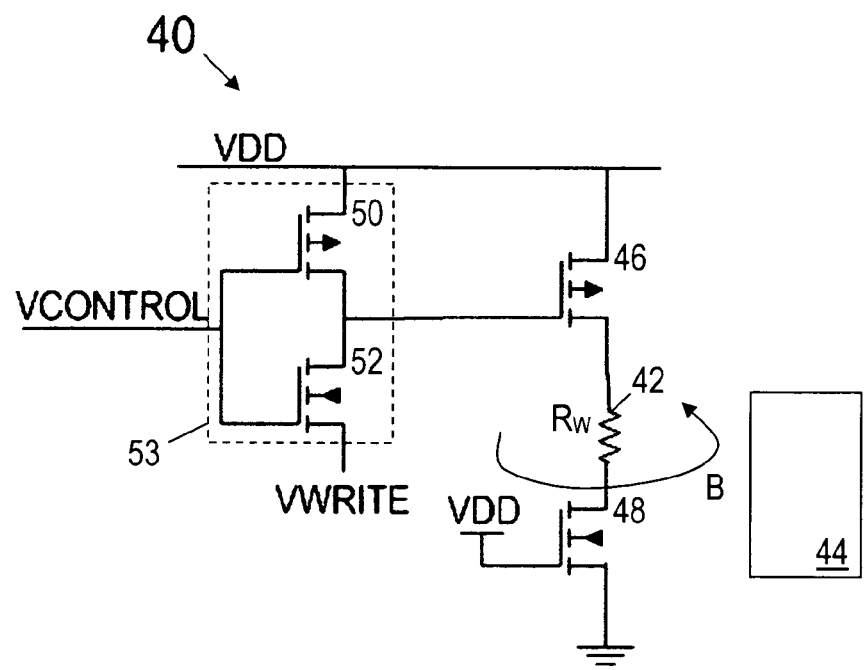
FIG. 3 shows a circuit for delivering current in a write line in accordance with various embodiments.

FIG. 3 illustrates another embodiment of the present invention that may be used as a magnetic memory write line driver. Circuit 40 may provide current control for write line 42 while minimizing the overhead voltage utilized and simplifying overall circuit design. Write line 42 may be magnetically coupled to memory element 44, and may be capable of altering the state of memory element 44. The supply voltage, indicated as $V_{DD}$, may be electrically coupled to the source terminal of a p-channel MOSFET 46. The drain terminal of transistor 46 may be electrically coupled to write line 42, which may be represented using a resistive element $R_W$. Write line 42 may also be electrically coupled to the drain terminal of an n-channel MOSFET 48. The source terminal of transistor 48 may be electrically coupled to ground, while the gate terminal of transistor 48 may be electrically coupled to the supply voltage $V_{DD}$.

A p-channel MOSFET 50 and an n-channel MOSFET 52 may form an inverter 53 and may have both of their drain terminals electrically coupled to the gate of transistor 46. The source terminal of transistor 50 may be electrically coupled to the supply voltage $V_{DD}$. The gate terminals of transistors 50 and 52 may be electrically coupled to a common control voltage $V_{control}$. The source terminal of transistor 52 may be electrically coupled to $V_{write}$. As the voltage at the input of inverter 53 switches, the output may switch between $V_{DD}$ and $V_{write}$. The threshold voltage of inverter 53 may be adjusted by varying the size of transistors 50 and 52 as well as varying the magnitude of $V_{write}$.

Inverter 53 may operate to switch the gate of transistor 46 between $V_{DD}$ and $V_{write}$ as $V_{control}$ is varied. For example, if $V_{control}$ equals $V_{DD}$, then transistor 50 may be turned off and transistor 52 may be on. With transistor 50 off and transistor 52 on, $V_{write}$ may be electrically coupled to the gate of transistor 46, so that as $V_{write}$ is varied, the amount of current in write line 42 may be adjusted because the gate-to-source voltage of transistor 46 may be varied.

Alternatively, if $V_{control}$ equals $V_{write}$, then transistor 52 may be off, and transistor 50 may couple the gate terminal of transistor 46 to $V_{DD}$. With the gate terminal of transistor 46 electrically coupled to $V_{DD}$, transistor 46 may be off and limit the amount of current in write line 42 to approximately zero.

Circuit 40 may be a desirable implementation because the circuitry for controlling the current (i.e., transistors 50 and 52) may be separated from the main current path (i.e., the series combination of transistor 46, write line 42, and transistor 48). With the controlling circuitry out of the main current path, $V_{write}$ may now be designed as a constant-current variable-voltage power supply and $V_{DD}$ may be designed as a variable-current constant-voltage power supply. Neither $V_{write}$ nor $V_{DD}$ require variable currents and variable voltages. Circuit 40 may be able to control the amount of current in write line 42 using a minimal amount of overhead voltage.

Figure 4:
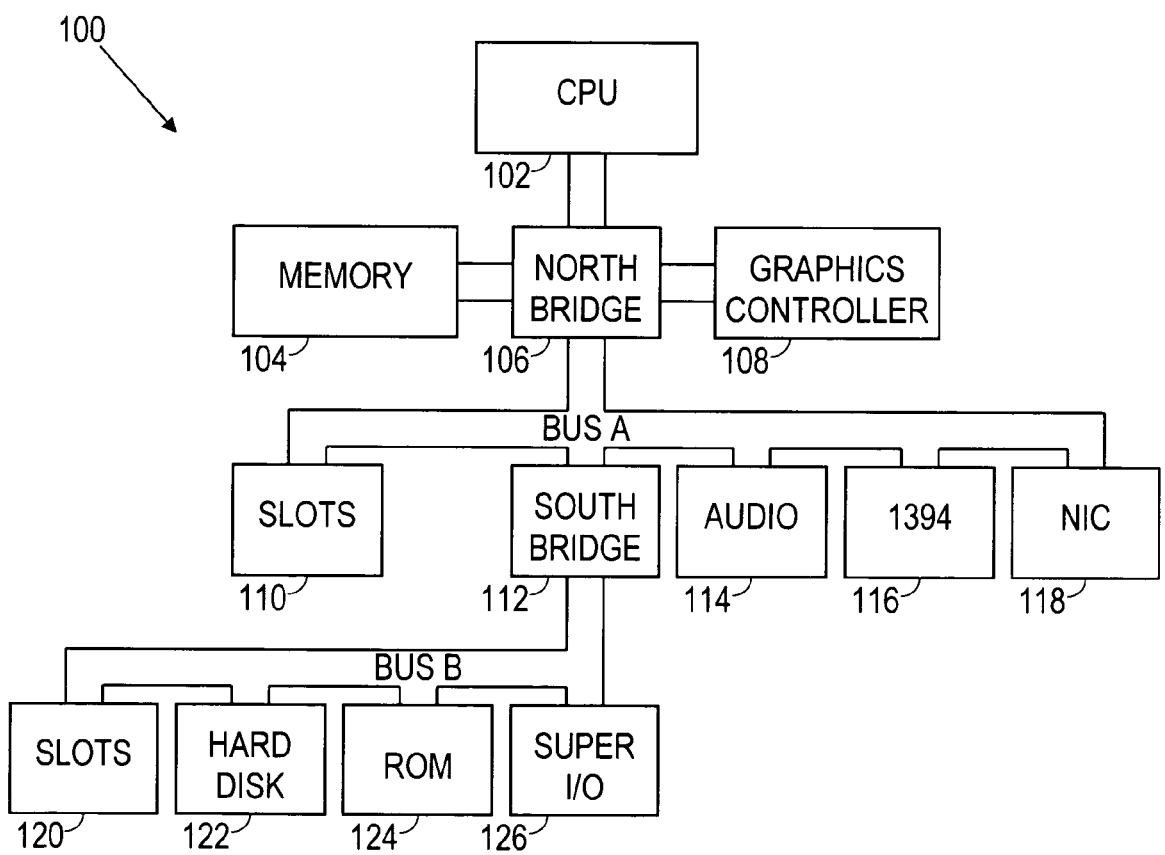
FIG. 4 shows an exemplary computer system.

The memory disclosed herein, and the methods for controlling current in memory write lines may be used in a computer system. FIG. 4 illustrates an exemplary computer system 100. The computer system of FIG. 4 includes a Central Processing Unit "CPU" 102 that may be electrically coupled to a bridge logic device 106 via a CPU bus. The bridge logic device 106 is sometimes referred to as a "North bridge." The North bridge 106 electrically couples to a main memory array 104 by a memory bus, and may further electrically couple to a graphics controller 108 via an advanced graphics processor ("AGP") bus. The main memory array 104 may be a magnetic memory array utilizing the disclosed methods for controlling the write line current. The North bridge 106 couples CPU 102, memory 104, and graphics controller 108 to the other peripheral devices in the system through, for example, a primary expansion bus ("BUS A") such as a Peripheral Component Interconnect ("PCI") bus or an Extended Industry Standard Architecture ("EISA") bus. Various components that operate using the bus protocol of BUS A may reside on this bus, such as an audio device 114, a IEEE 1394 interface device 116, and a network interface card ("NIC") 118. These components may be integrated onto the motherboard, as suggested by FIG. 4, or they may be plugged into expansion slots 110 that are connected to BUS A.

If other secondary expansion buses are provided in the computer system, another bridge logic device 112 may be used to electrically couple the primary expansion bus ("BUS A") to the secondary expansion bus ("BUS B"). This bridge logic 112 is sometimes referred to as a "South bridge." Various components that operate using the bus protocol of BUS B may reside on this bus, such as a hard disk controller 122, a system Read Only Memory ("ROM") 124, and Super Input/Output ("I/O") controller 126. Slots 120 may also be provided for plug-in components that comply with the protocol of BUS B.

The preferred embodiments of the present invention may allow the circuitry involved in controlling the amount of current in memory write lines to be separated from the write line current path. By separating the current control functions from the write line current path, a larger portion of supply voltage may be used in the write line current path, allowing greater control of the write line current. This may be especially useful as supply voltages decrease. In addition, the preferred embodiments of the present invention may simplify circuit design by eliminating the need for power supplies having variable-voltages and variable-currents.

The above discussion is meant to be illustrative of the principles and various embodiments of the present invention. Numerous variations and modifications will become apparent to those skilled in the art once the above disclosure is fully appreciated. For example, some of the embodiments are shown using complementary metal oxide semiconductor ("CMOS") technology, and as such the n-channel devices may be substituted for p-channel devices and vice versa, while maintaining similar circuit functionality. It is intended that the following claims be interpreted to embrace all such variations and modifications.

What is claimed is:

1. A method of increasing voltage available to a memory element, comprising:
   providing a current in a plurality of memory write lines, wherein the write lines are magnetically coupled to at least one memory element;
   coupling a first and second plurality of transistors to either end of the memory write line; and
   altering the conduction state of individual transistors within the first and second plurality of transistors;
   wherein the amount of voltage available is controlled by modifying the conduction state of the first and second plurality of transistors.

2. The method of claim 1, wherein the amount of voltage available to the memory element is increased.

3. The method of claim 1, wherein the individual transistors within the first and second pluralities of transistors are coupled in parallel and are binary weighted.

4. The method of claim 1, further comprising coupling a power supply to the first and second plurality of transistors, wherein the power supply has approximately constant voltage and provides a variable current.

5. A memory, comprising:
   a plurality of memory write lines magnetically coupled to at least one magnetic memory element;
   a write circuit including a plurality of transistors that are coupled to a memory write line;
   wherein individual transistors within the plurality of transistors are in parallel and have their conduction states modified independent of each other;
   wherein the individual transistors within the plurality of transistors are binary weighted; and
   whereby the amount of voltage available to the magnetic memory element is increased.

6. The memory of claim 5, further comprising logic coupled to the plurality of transistors, wherein the logic modifies the conduction state of individual transistors.

7. The memory of claim 5, further comprising a first and second plurality of transistors, wherein the first plurality of transistors source current in the memory write lines and the second plurality of transistors sink current from the memory write lines.

8. The memory of claim 7, wherein the first plurality of transistors comprise p-channel metal oxide semiconductor field effect transistors ("MOSFETs"), and the second plurality of transistors comprise n-channel MOSFETs.

9. The memory of claim 5, wherein the logic is coupled to the gate terminals of the plurality of transistors.

10. The memory of claim 5, wherein the amount of current in the write line is controlled by modifying the conduction state of individual transistors within the plurality of transistors.

11. The memory of claim 5, further comprising a power supply coupled to the write circuit, wherein the power supply has approximately constant voltage and provides a variable current.

12. A memory, comprising:
    at least one memory write line that is magnetically coupled to at least one magnetic memory element;
    a write circuit including first and second transistors that are coupled to either end of the memory write line;
    wherein the conduction state of the first transistor is controlled by an inverter circuit;
    wherein the inverter circuit electrically couples a write signal to the first transistor; and
    wherein a threshold voltage for the inverter is varied as the write signal is varied.

13. The memory of claim 12, wherein the conduction state of the first transistor is varied as the write signal is varied.

14. The memory of claim 13, wherein a control signal is coupled to the input of the inverter and controls the conduction state of the inverter.

15. The memory of claim 12, further comprising a power supply coupled to the write circuit, wherein the power supply has approximately constant voltage and provides a variable current.

16. The memory of claim 12, wherein the first transistor sources current to the memory write line and the second transistor sinks current from the memory write line.

17. A circuit for controlling current to a magnetic memory array, comprising:
providing means for providing current to a conductor;
sinking means for sinking current from the conductor; and
a controlling means for controlling the conduction state of said providing means and said sinking means;
wherein said conductor is magnetically coupled to coupled to a magnetic memory element;
wherein a threshold value for said controlling means is altered by a write signal.

18. The circuit of claim 17, wherein altering said conduction state results in altering the digital state of the magnetic memory element.

19. The circuit of claim 17, further comprising means for supplying power to the circuit.

20. The circuit of claim 19, wherein the means for supplying power has approximately constant voltage and provides a variable current.

21. A computer system, comprising:
a processor;
a bridge logic device coupled to the processor; and
a system memory coupled to said processor, wherein the system memory includes:
a power supply;
a first transistor coupled to the power supply;
a write conductor coupled to the first transistor, wherein the write conductor is magnetically coupled to a magnetic memory element;
a second transistor coupled to the write conductor, ground, and the power supply;
an inverter coupled the first transistor, wherein the inverter controls the conduction state of the first transistor;
wherein the power supply has approximately constant voltage and provides a variable current; and
wherein a threshold voltage for the inverter is variable.

22. The computer system of claim 21, wherein a control signal is coupled to the input of the inverter and controls the conduction state of the inverter.

23. The computer system of claim 21, wherein the threshold voltage for the inverter is variable.

24. The computer system of claim 21, wherein the first transistor sources current to the memory write line and the second transistor sinks current from the memory write line.

\* \* \* \* \*

UNITED STATES PATENT AND TRADEMARK OFFICE
CERTIFICATE OF CORRECTION

| | | |
|---|---|---|
| PATENT NO. | : 7,221,582 B2 | Page 1 of 1 |
| APPLICATION NO. | : 10/649078 | |
| DATED | : May 22, 2007 | |
| INVENTOR(S) | : Frederick A. Perner et al. | |

It is certified that error appears in the above-identified patent and that said Letters Patent is hereby corrected as shown below:

In column 7, line 10, in Claim 17, after "magnetically" delete "coupled to".

Signed and Sealed this

Fourth Day of November, 2008

JON W. DUDAS
*Director of the United States Patent and Trademark Office*